United States Patent
Zhang et al.

(10) Patent No.: US 11,798,923 B2
(45) Date of Patent: Oct. 24, 2023

(54) STAGGERED DUAL-SIDE MULTI-CHIP INTERCONNECT

(71) Applicant: NVIDIA Corp., Santa Clara, CA (US)

(72) Inventors: Shuo Zhang, Shenzhen (CN); Eric Zhu, Shenzhen (CN); Minto Zheng, Shenzhen (CN); Michael Zhai, Chengdu (CN); Town Zhang, Jiujiang (CN); Jie Ma, Shenzhen (CN)

(73) Assignee: NVIDIA CORP., Santa Clara, CA (US)

( * ) Notice: Subject to any disclaimer, the term of this patent is extended or adjusted under 35 U.S.C. 154(b) by 167 days.

(21) Appl. No.: 17/553,519

(22) Filed: Dec. 16, 2021

(65) Prior Publication Data

US 2023/0197696 A1 Jun. 22, 2023

(51) Int. Cl.
*H01L 23/538* (2006.01)
*H01L 25/10* (2006.01)
*H01L 25/16* (2023.01)
*H05K 1/18* (2006.01)

(52) U.S. Cl.
CPC ........ *H01L 25/105* (2013.01); *H01L 23/5386* (2013.01); *H01L 25/16* (2013.01); *H05K 1/181* (2013.01); *H01L 2225/107* (2013.01); *H01L 2225/1094* (2013.01); *H05K 2201/10015* (2013.01); *H05K 2201/10522* (2013.01); *H05K 2201/10545* (2013.01); *H05K 2201/10704* (2013.01)

(58) Field of Classification Search
CPC ......... H05K 1/181; H05K 2201/10015; H05K 2201/10522; H05K 2201/10545; H05K 2201/10704; H01L 23/5384; H01L 23/5386
See application file for complete search history.

(56) References Cited

U.S. PATENT DOCUMENTS

| | | | | |
|---|---|---|---|---|
| 5,243,497 A | * | 9/1993 | Chiu | H01L 23/5384 361/764 |
| 5,998,860 A | * | 12/1999 | Chan | H01L 23/3107 257/679 |
| 6,858,930 B2 | | 2/2005 | Miller et al. | |
| 6,963,129 B1 | | 11/2005 | Evans et al. | |
| 2006/0203456 A1 | * | 9/2006 | Sohn | H05K 3/4661 361/748 |
| 2013/0265726 A1 | * | 10/2013 | Murai | H05K 1/025 361/748 |
| 2013/0329390 A1 | * | 12/2013 | Shin | G11C 5/02 361/783 |
| 2020/0152855 A1 | * | 5/2020 | Lin | H01F 27/306 |
| 2021/0408655 A1 | * | 12/2021 | Prabhu Gaunkar | H01P 1/2002 |

* cited by examiner

*Primary Examiner* — Sherman Ng
(74) *Attorney, Agent, or Firm* — Rowan TELS LLC

(57) ABSTRACT

Layout techniques for chip packages on printed circuit boards are disclosed that address the multivariate problem of minimizing routing distances for high-speed I/O pins between chip packages while simultaneously providing for the rapid provision of transient power demands to the chip packages. The layout techniques may also enable improved thermal management for the chip packages.

16 Claims, 3 Drawing Sheets

STAGGERED DUAL-SIDE MULTI-CHIP INTERCONNECT

BACKGROUND

The insertion loss and crosstalk noise which are introduced by net routing path lengths on a printed circuit board (PCB) worsen as process nodes shrink (higher circuit density) and clock speeds increase. The path lengths for inter-chip communication in particular may limit performance.

Conventionally, very large integrated circuit devices, such as graphics processing units (GPUs), central processing units (CPUs), and systems-on-a-chip (SoC) are mounted on a circuit board as depicted in FIG. 1 or FIG. 2. For example a central processing unit 102 and a graphics processing unit 104 may be mounted on the same side of a printed circuit board 106 as depicted in FIG. 1. In this case a minimum inter-chip path length is determined by the spacing between the sides of the chips (or chip packages, more generally). Routing lengths between certain performance-critical pins on the chips may run several centimeters in some cases.

Another approach is to mount a first chip package 202 on a first side 204 of a printed circuit board 206, directly across from a second chip package 208 mounted on a second side 210 of the printed circuit board 206. In this case the minimum inter-chip path length is determined by the thickness of the printed circuit board 206. However the layout of other components utilized by either the first chip package 202, second chip package 208, or both becomes constrained. These other components are constrained to placement along side one chip package or the other.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Very large integrated circuit packages (e.g., GPUs, CPUs, SoCs) often draw large (relative to their average operating current) transient currents during certain operations, such as when initializing or performing certain power-intensive computational or input/output (I/O) operations. Components such as decoupling capacitors and power modules are ideally placed as close as possible to power pins of the chip packages to provide this transient energy quickly when needed. This competes with the requirements of high-speed I/O pins that communicate data and commands between chip packages.

Layout techniques for chip packages on PCBs are disclosed that address the multivariate problem of minimizing routing distances for high-speed I/O pins between chip packages while simultaneously providing for the rapid provision of transient power demands to the chip packages, and/or thermal management for the chip packages.

Figure 1:
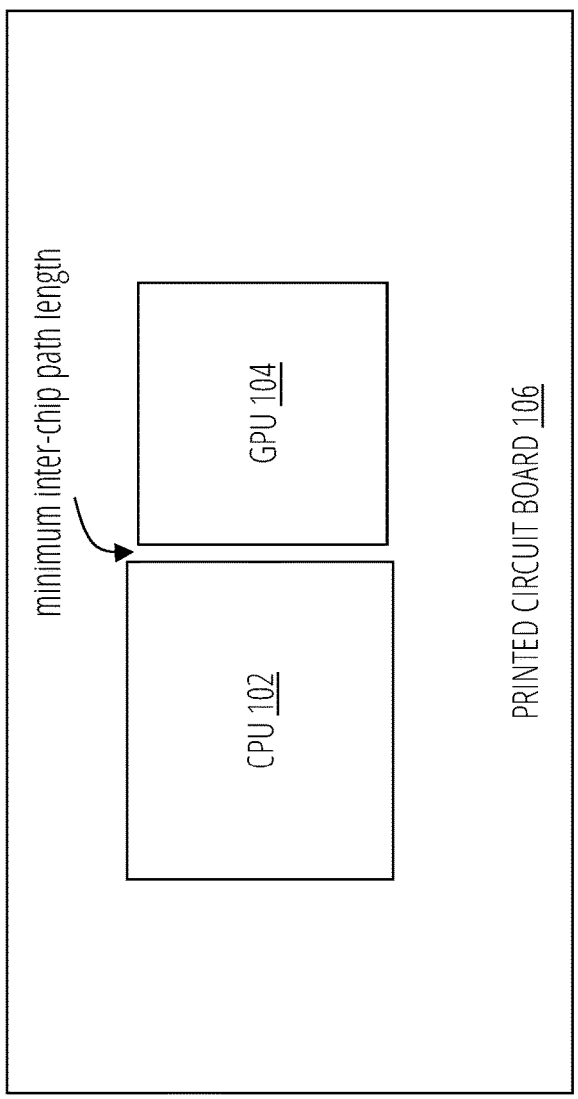
FIG. 1 depicts an example of side-by-side chip package mounting on a printed circuit board.

FIG. 1 depicts an example of side-by-side chip package mounting on a printed circuit board 106. The printed circuit board 106 comprises a central processing unit 102 package mounted adjacent to a graphics processing unit 104 package, on the same side of the printed circuit board 106. The physical constraints of such side-by-side mounting create a minimum inter-chip path length, which in turn imposes a maximum signaling rate between circuits on the central processing unit 102 and circuits on the graphics processing unit 104. Although this example involves a central processing unit 102 and a graphics processing unit 104, it is applicable generally to any types of computer chips.

Figure 2:
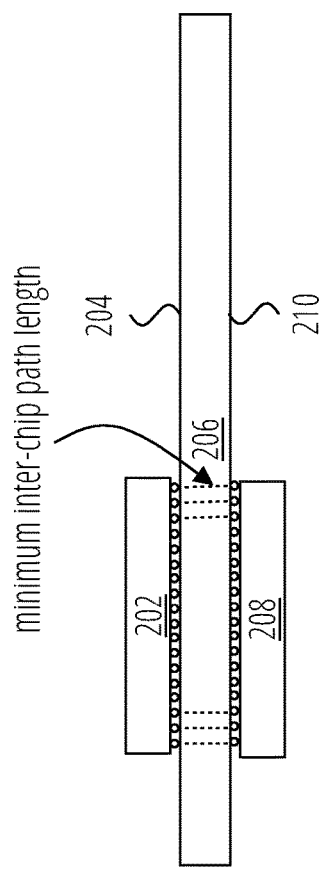
FIG. 2 depicts an example of stacked chip package mounting on a printed circuit board.

FIG. 2 depicts an example of stacked chip package mounting on a printed circuit board. A first chip package 202 is mounted on a first side 204 of the printed circuit board 206, and a second chip package 208 is mounted on a second side 210 of the printed circuit board 206. Some or all of the 10 pins of the first chip package 202 and second chip package 208 may be aligned with one another, minimizing the signaling length between them to be approximately the thickness of the printed circuit board 206. However, this mounting layout comes with additional disadvantages in that other components on the printed circuit board 206 that communicate with or supply the first chip package 202 and second chip package 208 cannot be mounted across from them on the printed circuit board 206 because that space is now occupied by one of the chip packages.

Figure 3A:
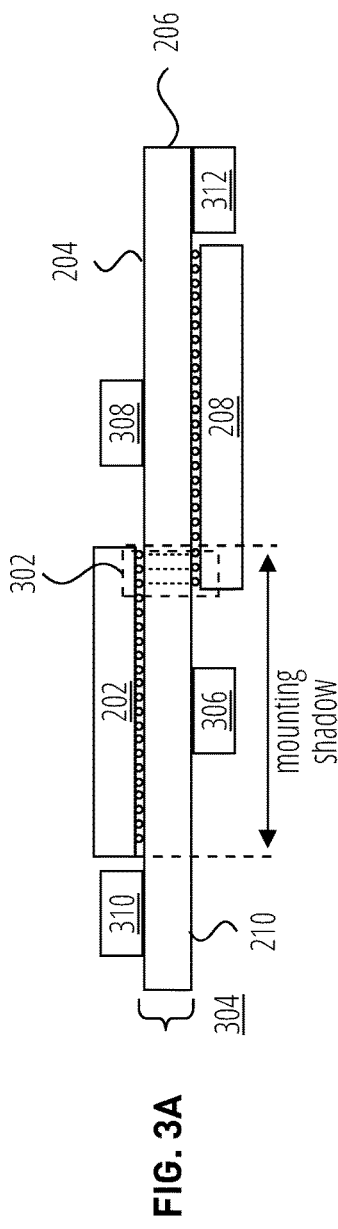
FIG. 3A depicts an example of stacked and staggered chip package mounting on a printed circuit board.

FIG. 3A depicts an example of stacked and staggered chip package mounting on a printed circuit board. The first chip package 202 is mounted on the first side 204 of the printed circuit board 206, and the second chip package 208 is mounted on the second side 210 of the printed circuit board 206, as before, but now staggered. The 10 pins of the first chip package 202 and second chip package 208 that communicate with one another are specifically located in an interconnect region 302 of each of the packages, such that they are aligned with one another across the thickness dimension 304 of the printed circuit board 206 when the packages are mounted on opposite sides of the printed circuit board 206. The interconnect region 302 may also be referred to herein as the "chip-to-chip critical inter-connection region". The interconnect region 302 encompasses an area along one side of the first chip package 202 and also along one overlapping side of the second chip package 208.

The interconnect region 302 may provide direct routing connections (e.g., using vias) between transmit and receive pins of the first chip package and the second chip package.

This mounting layout alleviates the prior disadvantages such that other components on the printed circuit board 206 that communicate with or supply the first chip package 202 (e.g., first chip package decoupling capacitor 306) and second chip package 208 (e.g., second chip package decoupling capacitor 308) can now be mounted across from them on the printed circuit board 206 because that space is no longer occupied by one of the chip packages. The first chip package decoupling capacitor 306 is located in the "mounting shadow" of the first chip package 202, that is, within the periphery of the first chip package 202 but on the opposite side of the printed circuit board 206 from the first chip package 202.

Figure 3B:
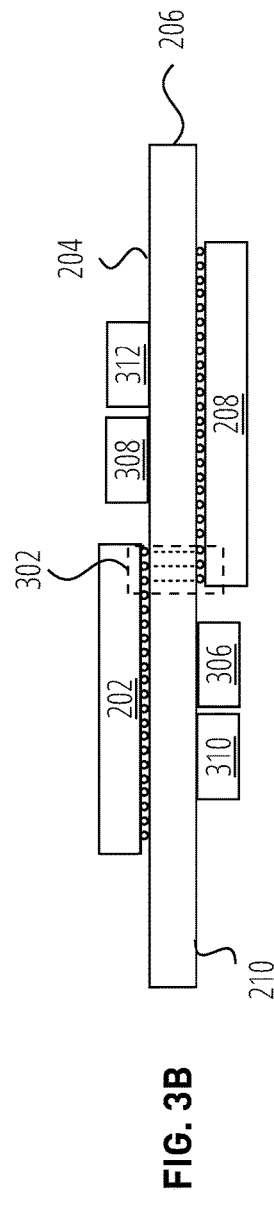
FIG. 3B depicts another example of stacked and staggered chip package mounting on a printed circuit board.

FIG. 3B depicts an alternative in which the first chip package power module 310 and first chip package decoupling capacitor 306 are mounted adjacent to one another on the second side 210 of the printed circuit board 206, across from the first chip package 202, and the second chip package decoupling capacitor 308 and second chip package power module 312 are mounted adjacent to one another on the first side 204 of the printed circuit board 206, across from the second chip package 208.

Figure 4A:
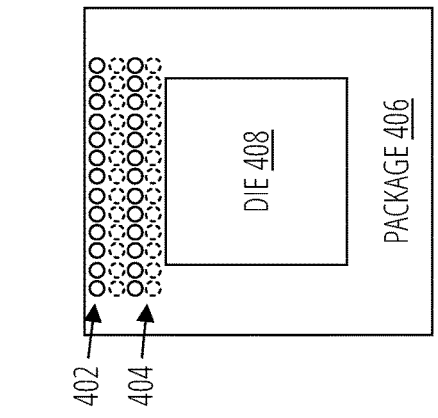
FIG. 4A depicts an example of transmit and receive pinout on a chip package in accordance with one embodiment.

FIG. 4A depicts an example of transmit (TX) and receive (RX) pinout on a chip package in accordance with one embodiment. One or more uniform rows of transmit pins 402 are combined with one or more uniform rows of receive pins 404 along a single side of the package 406 for an integrated circuit die 408. In some embodiments, all low-latency pins of the integrated circuit die 408, or substantially all (e.g., ≥75%) that communicate with another particular integrated circuit are concentrated along a single side. A "low-latency pin" is a pin with an operating rate (e.g., clock frequency) that is the fastest or among the fastest (e.g., in the top 10-20%) for a chip, such that the length of its routes to other chips is a limiting factor for the performance of the chip or system overall. In other words, it is a performance-critical pin. A "uniform row" is one that comprises only pins of a particular function, such as only data transmit (output) pins or only data receive (input) pins. In one embodiment the receive pins 404 are arranged in pairs, as are the transmit pins 402, resulting in two adjacent rows of transmit pins 402 adjacent to two adjacent rows of receive pins 404. This is referred to herein as a "uniform row pair" configuration of pins.

Figure 4B:
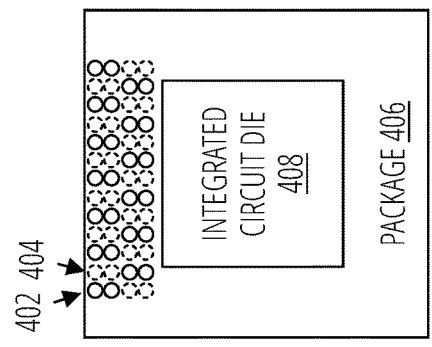
FIG. 4B depicts an example of transmit and receive pinout on a chip package in accordance with another embodiment.

FIG. 4B depicts an example of transmit and receive pinout on a chip package in accordance with another embodiment. In this embodiment, the transmit pins 402 are 1:1 interleaved with the receive pins 404 across each row, and each adjacent row is staggered, such that each pair of rows forms adjacent pairs of the transmit pins 402 and the receive pins 404 along its length. As with the embodiment in FIG. 4A, all or substantially all of the low-latency pins of the integrated circuit die 408 may be concentrated along a single side of the package 406. This is referred to herein as "interleaved staggered row pair" configuration of pins.

Figure 4C:
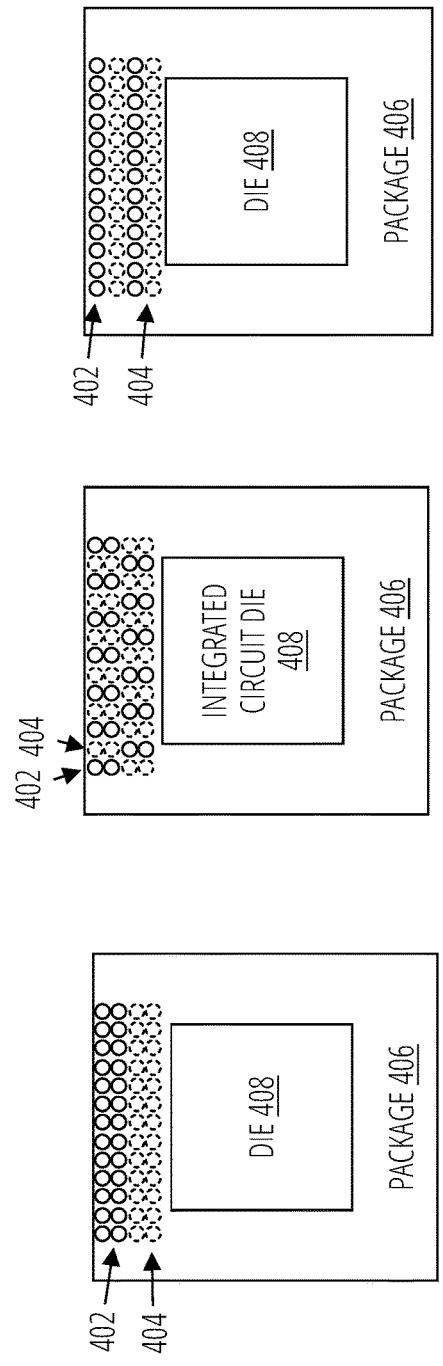
FIG. 4C depicts an example of transmit and receive pinout on a chip package in accordance with yet another embodiment.

FIG. 4C depicts an example of transmit and receive pinout on a chip package in accordance with yet another embodiment. Uniform rows of transmit pins 402 are interleaved with uniform rows of receive pins 404 along one side of the package 406. This is referred to herein as a "interleaved uniform row" configuration of pins.

The pinout of the side of the chip package to which the package 406 interfaces on the other side of the PCB is a mirror image of these pin layouts, with the transmit and receive pins swapped in position from those depicted in FIG. 4A—FIG. 4C. In other words, transmit pin/receive pin pairs are directly aligned with one another across the thickness dimension of the PCB.

Figure 5A:
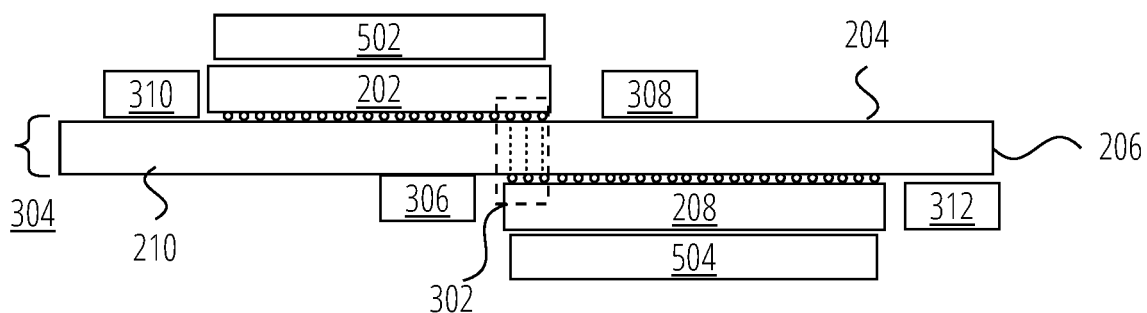
FIG. 5A depicts yet another example of stacked and staggered chip package mounting on a printed circuit board.

A layout of the type depicted in FIG. 3A, FIG. 3B, and FIG. 5A, where the chip packages are stacked and staggered on opposite sides of a PCB from one another, and the low latency/performance critical pins are primarily or completely located along a single side of each chip package, is referred to herein as a "stacked and staggered layout".

Figure 5B:
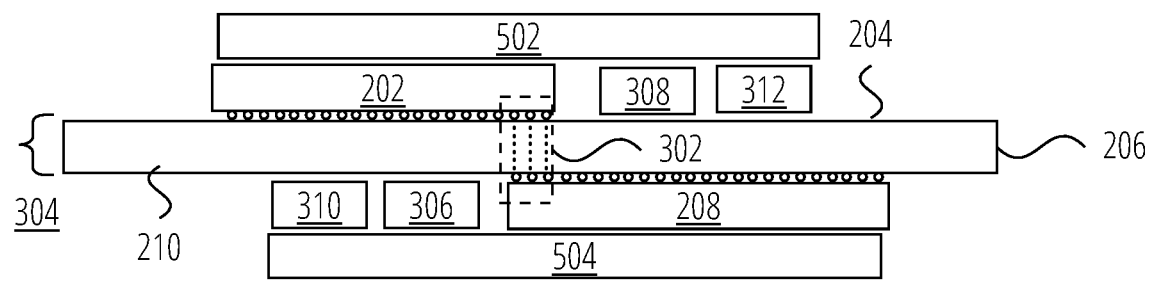
FIG. 5B illustrates an aspect of the subject matter in accordance with one embodiment.

FIG. 5A and FIG. 5B depict other examples of a stacked and staggered chip package mounting on a printed circuit board, in which a first chip package heat sink 502 is mounted on the first chip package 202 and a second chip package heat sink 504 is mounted one the second chip package 208. These layouts may prove efficient for managing temperatures of the chip packages especially during periods of higher power demand, while accommodating the routing constraints as previously described.

LISTING OF DRAWING ELEMENTS 102 central processing unit
104 graphics processing unit
106 printed circuit board
202 first chip package
204 first side
206 printed circuit board
208 second chip package
210 second side
302 interconnect region
304 thickness dimension
306 first chip package decoupling capacitor
308 second chip package decoupling capacitor
310 first chip package power module
312 second chip package power module
402 transmit pins
404 receive pins
406 package
408 integrated circuit die
502 first chip package heat sink
504 second chip package heat sink Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to"

perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A printed circuit board comprising: a first chip package mounted on a first side of the printed circuit board; a second chip package mounted on a second side of the printed circuit board in a stacked and staggered layout; a decoupling capacitor for the first chip package mounted in a mounting shadow of the first chip package; and a heat sink for the first chip package mounted in the mounting shadow of the first chip package.

2. The printed circuit board of claim 1, further comprising: a power module for the first chip package mounted adjacent to the first chip package on the first side of the printed circuit board.

3. The printed circuit board of claim 1, further comprising: a decoupling capacitor for the second chip package mounted in a mounting shadow of the second chip package.

4. The printed circuit board of claim 3, further comprising: a heat sink for the second chip package mounted in the mounting shadow of the second chip package.

5. The printed circuit board of claim 3, further comprising: a power module for the second chip package mounted adjacent to the second chip package on the second side of the printed circuit board.

6. A printed circuit board comprising: a first chip package mounted on a first side of the printed circuit board; a second chip package mounted on a second side of the printed circuit board in a stacked and staggered layout; an interconnect region between the first side of the printed circuit board and the second side of the printed circuit board comprising direct routing connections between transmit and receive pins of the first chip package and the second chip package; a decoupling capacitor for the first chip package mounted in a mounting shadow of the first chip package; and a heat sink for the first chip package mounted in the mounting shadow of the first chip package.

7. The printed circuit board of claim 6, wherein the interconnect region comprises a uniform row pair configuration of pins.

8. The printed circuit board of claim 6, wherein the interconnect region comprises an interleaved staggered row pair configuration of pins.

9. The printed circuit board of claim 6, wherein the interconnect region comprises an interleaved uniform row configuration of pins.

10. The printed circuit board of claim 6, further comprising: a decoupling capacitor for the second chip package mounted in a mounting shadow of the second chip package.

11. The printed circuit board of claim 10, further comprising: a heat sink for the second chip package mounted in the mounting shadow of the second chip package.

12. A printed circuit board comprising: a first chip package mounted on a first side of the printed circuit board; a second chip package mounted on a second side of the printed circuit board in a stacked and staggered layout; a decoupling capacitor and a heat sink for the first chip package mounted in a mounting shadow of the first chip package; a decoupling capacitor and a heat sink for the second chip package mounted in a mounting shadow of the second chip package; an interconnect region between the first side of the printed circuit board and the second side of the printed circuit board comprising one of a uniform row pair configuration of pins, an interleaved staggered row pair configuration of pins, and an interleaved uniform row configuration of pins.

13. The printed circuit board of claim 12, further comprising: a power module for the first chip package mounted adjacent to the first chip package on the first side of the printed circuit board.

14. The printed circuit board of claim 12, further comprising: a power module for the second chip package mounted adjacent to the second chip package on the second side of the printed circuit board.

15. The printed circuit board of claim 12, wherein the first chip package is a graphics processing unit and the second chip package is a central processing unit.

16. The printed circuit board of claim 12, wherein at least one of the first chip package and the second chip package comprises a system-on-a-chip.

* * * * *